US008773020B2

(12) United States Patent
Leray et al.

(10) Patent No.: US 8,773,020 B2
(45) Date of Patent: Jul. 8, 2014

(54) APPARATUS FOR FORMING A MAGNETIC FIELD AND METHODS OF USE THEREOF

(75) Inventors: Gary Leray, Mountain view, CA (US);
Shahid Rauf, Pleasanton, CA (US);
Valentin N. Todorow, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 223 days.

(21) Appl. No.: 13/097,800

(22) Filed: Apr. 29, 2011

(65) Prior Publication Data

US 2012/0097870 A1    Apr. 26, 2012

Related U.S. Application Data

(60) Provisional application No. 61/405,970, filed on Oct. 22, 2010.

(51) Int. Cl.
  *G21K 1/093* (2006.01)
  *H01J 37/32* (2006.01)
  *H05H 1/04* (2006.01)
(52) U.S. Cl.
  USPC ............ 315/111.41; 315/111.21; 315/111.51; 315/111.71; 315/111.81; 156/345.1; 156/345.46; 156/345.51
(58) Field of Classification Search
  USPC ........ 315/111.21–111.91; 156/345.1, 345.46, 156/345.51
  See application file for complete search history.

(56) References Cited

U.S. PATENT DOCUMENTS

| 4,829,215 A |   | 5/1989 | Kim et al. |
| 4,842,683 A |   | 6/1989 | Cheng et al. |
| 5,215,619 A |   | 6/1993 | Cheng et al. |
| 5,449,977 A |   | 9/1995 | Nakagawa et al. |
| 5,534,108 A |   | 7/1996 | Qian et al. |
| 5,717,294 A | * | 2/1998 | Sakai et al. ............. 315/111.41 |
| 6,015,476 A |   | 1/2000 | Schlueter et al. |
| 6,113,731 A |   | 9/2000 | Shan et al. |
| 6,545,580 B2 | * | 4/2003 | Hegde et al. ................. 335/296 |
| 6,716,302 B2 |   | 4/2004 | Carducci et al. |
| 6,805,770 B1 |   | 10/2004 | Oster |
| 6,937,127 B2 |   | 8/2005 | Oster |
| 7,316,199 B2 |   | 1/2008 | Horioka et al. |
| 7,374,636 B2 |   | 5/2008 | Horioka et al. |
| 7,422,654 B2 |   | 9/2008 | Lindley et al. |

(Continued)

FOREIGN PATENT DOCUMENTS

KR     2001-0069270 A    7/2001

OTHER PUBLICATIONS

International Search Report and Written Opinion mailed May 2, 2012 for PCT Application No. PCT/US2011/057025.

*Primary Examiner* — Douglas W Owens
*Assistant Examiner* — Thai Pham
(74) *Attorney, Agent, or Firm* — Moser Taboada; Alan Taboada (57) ABSTRACT

Apparatus for forming a magnetic field and methods of use thereof are provided herein. In some embodiments, a plurality of coils having substantially similar dimensions disposed about a process chamber in a symmetric pattern centered about a central axis of the process chamber, wherein the plurality of coils are configured to produce a magnetic field having a plurality of magnetic field lines that are substantially planar and substantially parallel. In some embodiments, the plurality of coils comprises eight coils disposed about the process chamber, wherein each of the eight coils is offset by an angle of about 45 degrees from respective adjacent coils of the eight coils.

19 Claims, 7 Drawing Sheets

(56) References Cited

U.S. PATENT DOCUMENTS

| | | |
|---|---|---|
| 7,879,186 B2 | 2/2011 | Lindley et al. |
| 7,883,633 B2 | 2/2011 | Lindley et al. |
| 8,048,328 B2 | 11/2011 | Lindley et al. |
| 2004/0084151 A1* | 5/2004 | Kim .................... 156/345.46 |
| 2004/0182516 A1* | 9/2004 | Lindley et al. ........ 156/345.46 |
| 2006/0192150 A1* | 8/2006 | Demos et al. ........ 250/492.22 |
| 2008/0277063 A1* | 11/2008 | Shin .................... 156/345.29 |

\* cited by examiner

APPARATUS FOR FORMING A MAGNETIC FIELD AND METHODS OF USE THEREOF

CROSS-REFERENCE TO RELATED APPLICATIONS

This application claims benefit of U.S. provisional patent application Ser. No. 61/405,970, filed Oct. 22, 2010, which is herein incorporated by reference.

FIELD

Embodiments of the present invention generally relate to plasma enhanced substrate processing.

BACKGROUND

Plasma enhanced substrate processing is commonly used, for example, in the manufacture of semiconductor devices and integrated circuits. Such processing generally includes introducing a process gas into a process chamber having a substrate, such as a semiconductor wafer, disposed therein and applying sufficient energy to the process gas to form a plasma over the substrate. The plasma contains dissociated and ionized components as well as neutral components that operate to assist the process being performed on the substrate (such as deposition, etching, and the like). Although the constituents of the plasma are beneficial for assisting or carrying out the process on the substrate, unconstrained plasma components may impinge on the substrate and/or chamber components causing damage. In addition, plasma non-uniformities may lead to non-uniform processing of substrates.

To control the plasma, conventional process chambers may include a magnetic field forming device configured to produce a magnetic field within the process chamber to constrain plasma components. However, the magnetic field produced by such conventional configurations typically comprise non-parallel and non-planar magnetic field lines, resulting in non-uniform plasma confinement, and therefore, non-uniform processing of the substrate.

Therefore, the inventors have provided an improved apparatus for controlling a plasma and methods of use thereof.

SUMMARY

Apparatus for forming a magnetic field and methods of use thereof are provided herein. In some embodiments, a plurality of coils having substantially similar dimensions disposed about a process chamber in a symmetric pattern centered about a central axis of the process chamber, wherein the plurality of coils are configured to produce a magnetic field having a plurality of magnetic field lines that are substantially planar and substantially parallel. In some embodiments, the plurality of coils comprises eight coils disposed about the process chamber, wherein each of the eight coils is offset by an angle of about 45 degrees from respective adjacent coils of the eight coils.

In some embodiments, a method performed in a process chamber comprising a plurality of coils having substantially similar dimensions disposed symmetrically about an exterior of the process chamber with respect to a central axis of the process chamber is provided. In some embodiments, a method may include providing a first current to two opposing coils selected from the plurality of coils; and concurrently providing a second current to coils adjacent to the two opposing coils to create a magnetic field in a first vector direction having magnetic field lines that are substantially planar and substantially parallel throughout a region of the magnetic field disposed above a substrate support of the process chamber, wherein a size of the region corresponds to a size of the substrate support.

In some embodiments, a process chamber may include: a substrate support disposed within the process chamber; and an apparatus for forming a magnetic field disposed proximate the substrate support to form a magnetic field proximate a top surface of a substrate disposed atop the substrate support, the apparatus for forming the magnetic field comprising: a plurality of coils having substantially similar dimensions disposed about the process chamber in a symmetric pattern centered about a central axis of the process chamber, wherein the plurality of coils are configured to produce a magnetic field having a plurality of magnetic field lines that are substantially planar and substantially parallel; and at least one power source coupled to the plurality of coils and configured to selectively provide current to at least two groups of coils selected from the plurality of coils.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to an apparatus for controlling a plasma and methods of use thereof. Embodiments of the inventive apparatus and methods may advantageously allow for substantially planar and parallel magnetic field to be formed in multiple directions, thereby providing an increased flexibility in plasma processing. In addition, the inventive apparatus provides a coil configuration of comparatively small volume about a process chamber as opposed to conventional coil configurations (e.g. a Helmholtz coil configuration). Embodiments of the inventive apparatus and methods may further advantageously more uniformly constrain a plasma formed within a process chamber, thereby leading to more uniform processing results.

Figure 1:
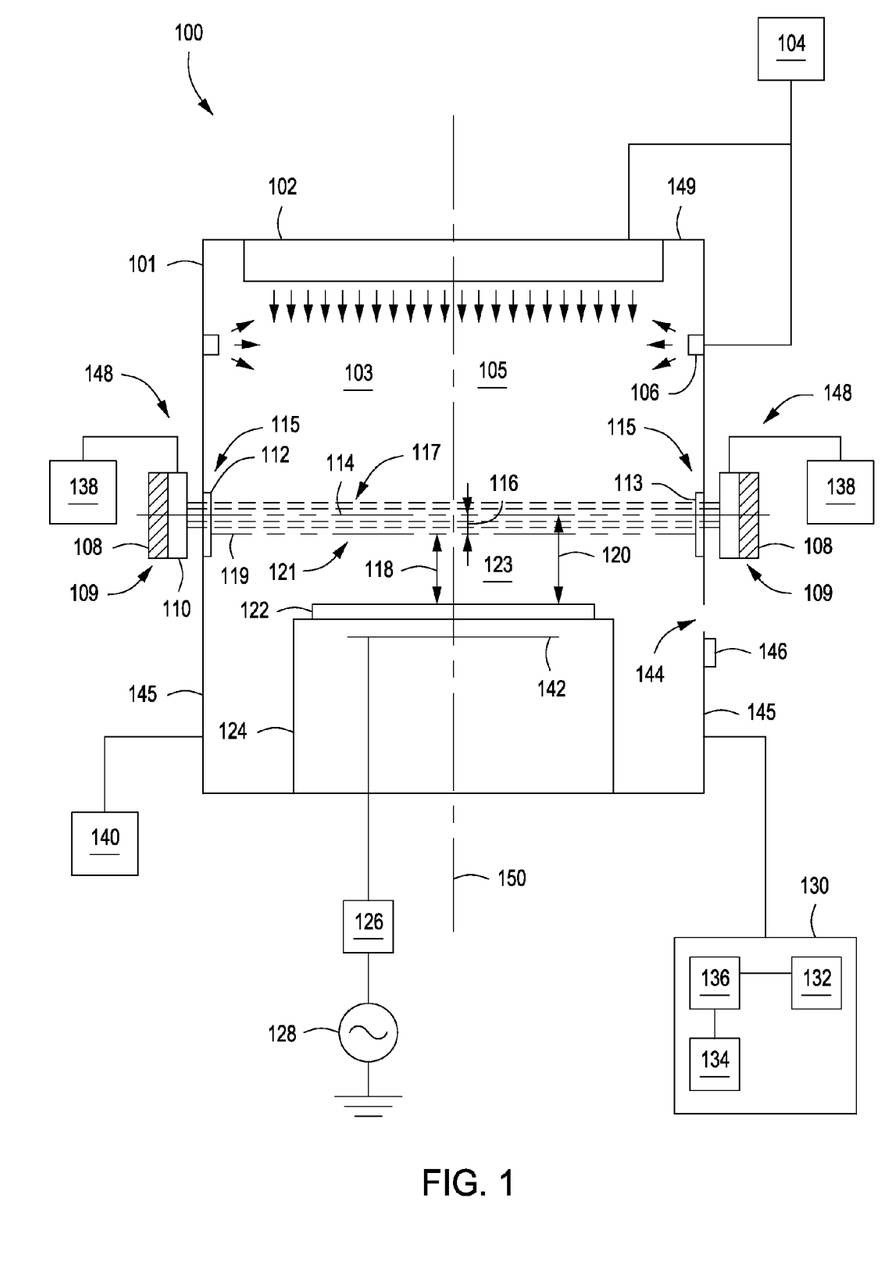
FIG. 1 depicts a schematic side view of a process chamber having an apparatus for controlling a plasma in accordance with some embodiments of the present invention.

FIG. 1 depicts a process chamber 100 suitable for use with an apparatus for forming a magnetic field in accordance with some embodiments of the present invention. Exemplary process chambers may include the DPS®, ENABLER®, ADVANTEDGE™, or other process chambers, available from Applied Materials, Inc. of Santa Clara, Calif. Other suitable process chambers may similarly be used.

The process chamber 100 generally comprises a chamber body 101 defining an inner volume 103 that may include a processing volume 105. The processing volume 105 may be defined, for example, between a substrate support pedestal 124 disposed within the process chamber 100 for supporting a substrate 122 thereupon during processing and one or more gas inlets, such as a showerhead 102 and/or nozzles 106 provided at desired locations. In some embodiments, the substrate support pedestal 124 may include a mechanism that retains or supports the substrate 122 on the surface of the substrate support pedestal 124, such as an electrostatic chuck, a vacuum chuck, a substrate retaining clamp, or the like (not shown). In some embodiments, the substrate support pedestal 124 may include mechanisms for controlling the substrate temperature (such as heating and/or cooling devices, not shown) and/or for controlling the species flux and/or ion energy proximate the substrate surface.

For example, in some embodiments, the substrate support pedestal 124 may include an electrode 142. The electrode 142 may be coupled to one or more bias power sources (one bias power source 128 shown) through one or more respective matching networks (matching network 126 shown). The one or more bias power sources may provide RF or DC energy in a pulsed or continuous mode. For example, in some embodiments, the one or more bias power sources may be capable of producing up to 12,000 W of RF energy at a desired frequency, such as about 2 MHz, or about 13.56 MHz, or about 60 MHz, or the like. In some embodiments, two or more bias power sources may be provided for coupling RF power through respective matching networks to the RF bias electrode 340 at respective frequencies of, for example, any of the frequencies discussed above. One or more of the bias power sources may provide either continuous or pulsed power. In some embodiments, the one or more bias power sources 128 may be a DC or pulsed DC source.

The substrate 122 may enter the process chamber 100 via an opening 144 in a wall 145 of the chamber body 101. The opening 144 may be selectively sealed via a slit valve 146, or other mechanism for selectively providing access to the interior of the chamber through the opening 144. The substrate support pedestal 124 may be coupled to a lift mechanism (not shown) that may control the position of the substrate support pedestal 124 between a lower position suitable for transferring substrates into and out of the chamber via the opening 144 and a selectable upper position suitable for processing. The process position may be selected to maximize process uniformity for a particular process. When in at least one of the elevated processing positions, the substrate support pedestal 124 may be disposed above the opening 146 to provide a symmetrical processing region.

The showerhead 102 and/or nozzles 106 may be coupled to a gas supply 104 for providing one or more process gases into the processing volume 105 of the process chamber 100. Although only two nozzles 106 are shown in FIG. 1 disposed on the walls 145 of the chamber body 101, additional or alternative gas nozzles or inlets may be disposed in the ceiling 149 or on the walls 145 of the chamber body 101 or at other locations suitable for providing gases as desired to the process chamber 100, such as the base of the process chamber 100, the periphery of the substrate support pedestal 124, or the like. An exhaust system 140 comprising a vacuum pump (not shown) may be coupled to the process chamber 100 for pumping out the exhaust gases from the inner volume 103.

In some embodiments, the process chamber 100 may utilize an electron beam generator 115 to generate an electron beam 121 to ignite a process gas (e.g. a process gas provided by gas supply 104) to form a plasma in the processing volume 105. For example, in such embodiments the process chamber 100 may comprise a cathode 112 disposed on a wall 145 of the chamber body 101 and configured to produce electrons having an adequate amount of energy to ignite the process gas. An anode 113 may be disposed on a wall 145 opposite the cathode 112 and configured to attract the electrons produced by the cathode 112.

The electron beam generator 115 may be disposed at any position within the process chamber 100 to provide the electron beam 121 at a suitable distance from the substrate 122 to perform a desired process. For example, in some embodiments, the electron beam generator 115 may be positioned such that a distance 118 between a central axis 119 of the electron beam 121 and an upper surface of the substrate 122 may be about 1 cm to about 30 cm. In some embodiments, the distance 118 may be selected to adjust the plasma density in an area 123 proximate the substrate. For example, as the distance 118 between the central axis 119 of the electron beam 121 and the substrate 122 decreases the density of the plasma in the area 123 proximate the substrate 122 may increase. Alternatively, as the distance 118 between the central axis 119 of the electron beam 121 and the substrate 122 increases, the density of the plasma in the area 123 proximate the substrate 122 may decrease.

A magnetic field forming device 148 (described more fully below with respect to FIGS. 2-4) is disposed proximate the walls 145 of the chamber body 101 and configured to form a magnetic field 117 having magnetic field lines that are substantially planar and substantially parallel to facilitate control over the plasma formed in the processing volume 105. The magnetic field forming device 148 generally comprises a plurality of coils 110 positioned symmetrically about a central axis 150 of the process chamber 100. The magnetic field forming device 148 may comprise any amount of coils 110 suitable for forming a magnetic field (i.e., magnetic field 117) having the desired shape and orientation.

One or more power supplies 138 may be coupled to the plurality of coils 110 to selectively provide an electric current through one or more of the plurality of coils 110 to produce the desired magnetic field 117 within the process chamber 100. In operation, the magnetic field 117 confines at least some of the electrons (negatively charged particles) of the electron beam 121 and/or the plasma, thereby facilitating control over the plasma.

In some embodiments, a shield 108 may be disposed around the plurality of coils 110 to shield other equipment (e.g., controllers, process chambers, other fabrication equipment, or the like) from the magnetic field 117. The shield 108 may comprise any material suitable to impede the magnetic field 117, such as a metal, for example stainless steel. In addition, the shield 108 may have any suitable geometry (e.g., size and shape) that provides the desired shielding effect. For example, in some embodiments, the shield 108 may be sized to cover an outer facing surface 109 of the plurality of coils 110. The shield 108 may be continuous and extend from coil to coil, or alternatively, the shield 108 may comprise a plurality of discrete elements disposed proximate each individual coil (or groups of coils). The shield 108 may be in direct contact with the coils or may be spaced apart from the coils.

The magnetic field forming device 148 may be disposed at any position about the process chamber 100 to provide the magnetic field 117, and therefore control the plasma, in a suitable location with respect to the substrate 122. For example, in some embodiments, the magnetic field forming device 148 may be positioned such that a distance 120 between a central axis 114 of the magnetic field 117 and the substrate 122 may be about 1 cm to about 30 cm In some embodiments, the distance 120 may be selected to adjust the plasma density in an area 123 proximate the substrate. For example, as the distance 120 between the central axis 114 of the magnetic field 117 and the substrate 122 decreases the density of the plasma in the area 123 proximate the substrate 122 may increase. Alternatively, as the distance 120 between the central axis 114 of the magnetic field 117 and the substrate 122 increases, the density of the plasma in the area 123 proximate the substrate 122 may decrease.

In addition, the position of the magnetic field forming device 148 and the electron beam generator 115 may be selected to adjust a distance 116 between the central axis 114 of the magnetic field 117 and the central axis 119 of the electron beam 121. In some embodiments, by varying the distance 116 between the central axis 114 of the magnetic field 117 and the central axis 119 of the electron beam 121, the amount of electrons of the electron beam 121 confined to a given plane may be adjusted. In some embodiments, the inventors have observed as the distance 116 between the central axis 114 of the magnetic field 117 and the central axis 119 of the electron beam 121 is decreased more of the electrons of the electron beam 121 are confined to a given plane, thus increasing the confinement (and reducing or eliminating divergence) of the electron beam 121, thereby preventing electrons from the electron beam 121 from impinging on the substrate 122. For example, in some embodiments the distance 116 between the central axis 114 of the magnetic field 117 and the central axis 119 of the electron beam 121 may be up to about a thickness of the electron beam 121.

Figure 2:
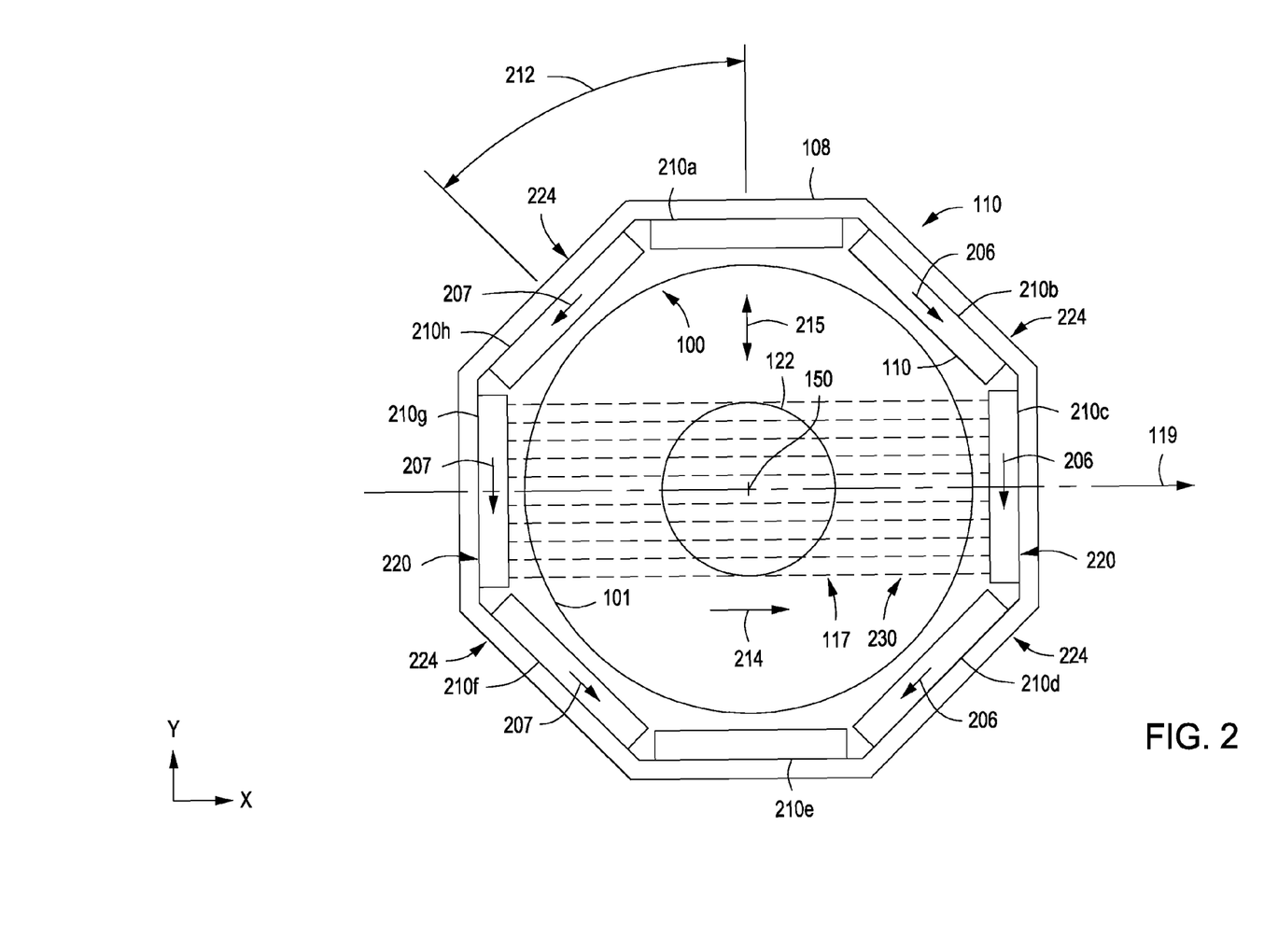
FIG. 2 is a top view of an apparatus for controlling a plasma in accordance with some embodiments of the present invention.

Referring to FIG. 2, in some embodiments, the plurality of coils 110 may comprise eight coils 210a-h disposed about the central axis 150 of the process chamber 100. In such embodiments, the eight coils 210a-h may be arranged in a symmetrical pattern wherein each of the eight coils 210a-h is offset by an angle 212 of about 45 degrees from a respective adjacent coil of the eight coils 210a-h. In some embodiments, each coil may have a substantially similar size, shape, and strength (e.g., number of turns of wire forming the coil).

In operation, subsets of the plurality of coils 110 may be utilized to form the magnetic field 117 having a desired shape and orientation in a desired vector direction. For example, in some embodiments, six coils (i.e., coils 210b, 210c, 210d, 210f, 210g, 210h) of the eight coils 210a-h may be utilized to form the magnetic field 117. For example, in such embodiments, a first current may be provided to a first group of coils (primary coils 220) comprising two coils 210c, 210g to generate the magnetic field 117 having magnetic field lines 230 oriented in a vector direction 214. The first current may flow in opposite directions with respect to the opposing coils. For example, the first current may be applied in a first direction 206 about a first coil (e.g., coil 210c) of the primary coils 220 and in a second direction 207 opposite the first direction 206 about a second coil (e.g., coil 210g) of the primary coils 220.

The arrows depicting the first direction 206 and the second direction 207 schematically indicate the general direction of current flow across the top of the respective coils. Since the coils 210c and 210g are opposing, the first direction 206 and the second direction 207 both are illustratively moving down the page in the frame of reference of FIG. 2. Alternatively, the opposing coils may be wound in opposite directions to cause the current to flow in opposite directions.

A second current may be concurrently provided to a second group of coils (secondary coils 224) adjacent to the first group of coils (for example, four coils 210b, 210d, 210f, 210h) to cause the magnetic field lines to be substantially planar and substantially parallel throughout a region of the magnetic field disposed above substrate support of the process chamber. For example, the magnetic field lines created by the second group of coils may compress the magnetic field lines created by the first group of coils with respect to a direction 215 perpendicular to the vector direction 214. The second current may be applied in the first direction 206 about secondary coils adjacent to the primary coil that also has current flowing in the first direction (e.g., primary coil 210c and secondary coils 210b, 210d). The second current may be applied in the second direction 207 about secondary coils adjacent to the primary coil that also has current flowing in the second direction (e.g., primary coil 210g and secondary coils 210f, 210h). By providing the plurality of coils 110 in the manner and operation described above, the inventors have observed that the desired magnetic field 117 may be formed using the magnetic field forming device 148 configured in a comparatively small volume about a process chamber as opposed to conventional coil configurations (e.g. a Hemholtz coil configuration).

In some embodiments, a ratio of the first current to the second current may be varied to control the shape and/or contours of the magnetic field lines 230 within the magnetic field 117 in the plane parallel to the substrate 122 to compensate for plasma effects. For example, the ratio of the first current to the second current may be about 2:1 to about 1:5. In some embodiments, the inventors have observed if the ratio is higher towards the first current, the magnetic field lines 230 in the plane parallel to the substrate 122 may be convex (i.e., divergent). Alternatively, in some embodiments, if the ratio is higher towards the second current, the magnetic field lines 230 in the plane parallel to the substrate 122 may be concave (i.e., convergent).

Figure 5A:
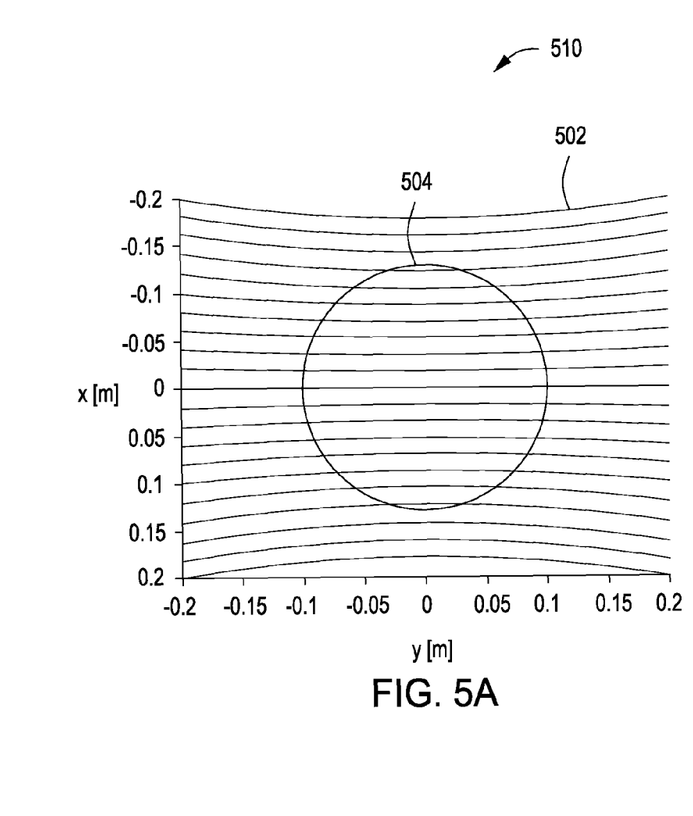
FIGS. 5A-C depicts a graph showing top views of magnetic field lines superimposed over a substrate in accordance with some embodiments of the present invention.
Figure 5B:
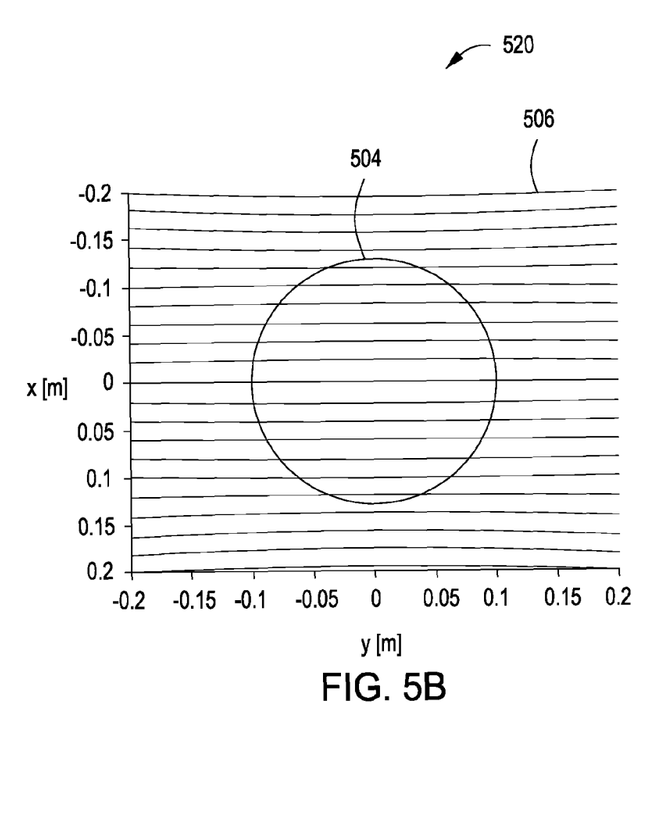
Figure 5C:
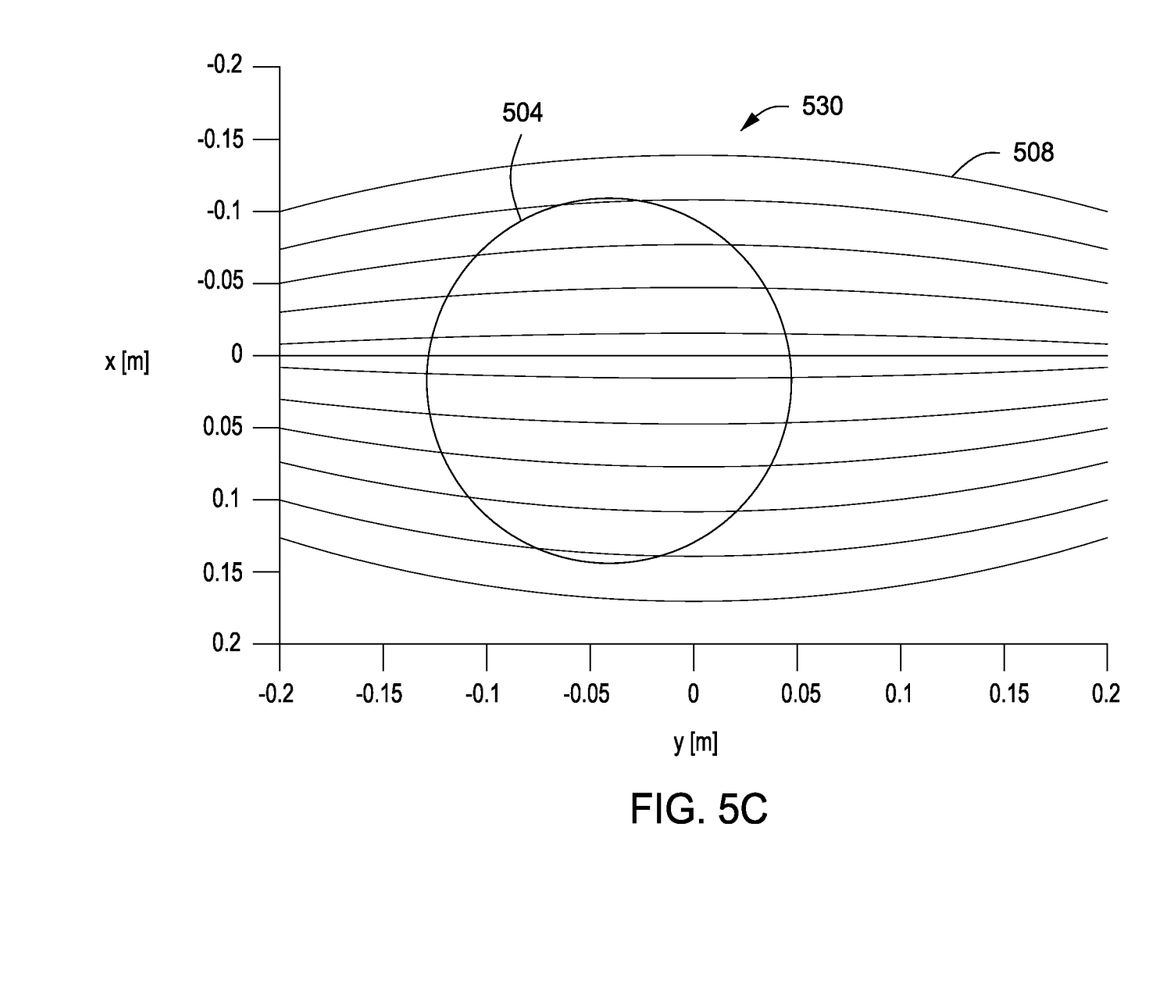

For example, FIGS. 5A-C respectively depict top views of the shape of magnetic field lines created at three different ratios of the first current to the second current. FIG. 5A depicts a graph 510 showing a top view of magnetic field lines 502 superimposed over a substrate 504 where the ratio of the first current to the second current is about 1:1. As shown in FIG. 5A, the magnetic field lines 502 are generally parallel over the predominant portion of the substrate 504, although the magnetic field lines 502 near the outer edges, or outer region, of the magnetic field are slightly curved outward (e.g., concave). The magnetic field lines 502 proximate the outer region of the magnetic field may have a greater radius of curvature than that of the magnetic field lines 502 proximate a central axis of the magnetic field.

FIG. 5B depicts a graph 520 showing a top view of magnetic field lines 506 superimposed over a substrate 504 where the ratio of the first current to the second current is about 2:1. As shown in FIG. 5B, the magnetic field lines 506 are generally parallel over the predominant portion of the substrate 504, and the magnetic field lines 506 near the outer edges, or outer region, of the magnetic field are much less curved (e.g., concave).

FIG. 5C depicts a graph 530 showing a top view of magnetic field lines 508 superimposed over a substrate 504 where the ratio of the first current to the second current is about 1:5. As shown in FIG. 5C, the magnetic field lines 508 are generally parallel over the predominant portion of the substrate 504, and the magnetic field lines 508 near the outer edges, or outer region, of the magnetic field are slightly curved inward (e.g., convex).

Returning to FIG. 2, in some embodiments, the magnitude of the magnetic field 117 may be varied by to tune the uniformity of a plasma formed within the process chamber 100. In some embodiments, the magnitude of the magnetic field 117 may be varied by increasing or decreasing the first current and second current. Alternatively, or in combination, the magnitude of the magnetic field 117 may be varied by increasing or decreasing an amount of a conductor wound about a core (e.g. a number of turns) when constructing of the plurality of coils 110 (for example, as described below with respect to FIG. 4.) In some embodiments, the magnetic field 117 may comprise a magnitude of about 44 to 52 Gauss, or in some embodiments about 60 to 70 Gauss. In some embodiments, by increasing or decreasing the magnitude of the magnetic field 117, a radius of the circular motion of the electrons formed in the plasma with respect to a plane perpendicular to the magnetic field 117 (i.e., the Larmor radius) may be increased or decreased. For example, as the magnitude of the magnetic field 117 is increased, the Larmor radius may decrease which reduces the electron divergence due to collisions with other particles.

Although the above embodiments are described with respect to forming a magnetic field 117 having magnetic field lines 230 orientated in vector direction 214, it is to be noted that the magnetic field 117 may be formed in other directions by utilizing any six of the eight coils 210a-h in a manner similar to that described above.

Figure 3:
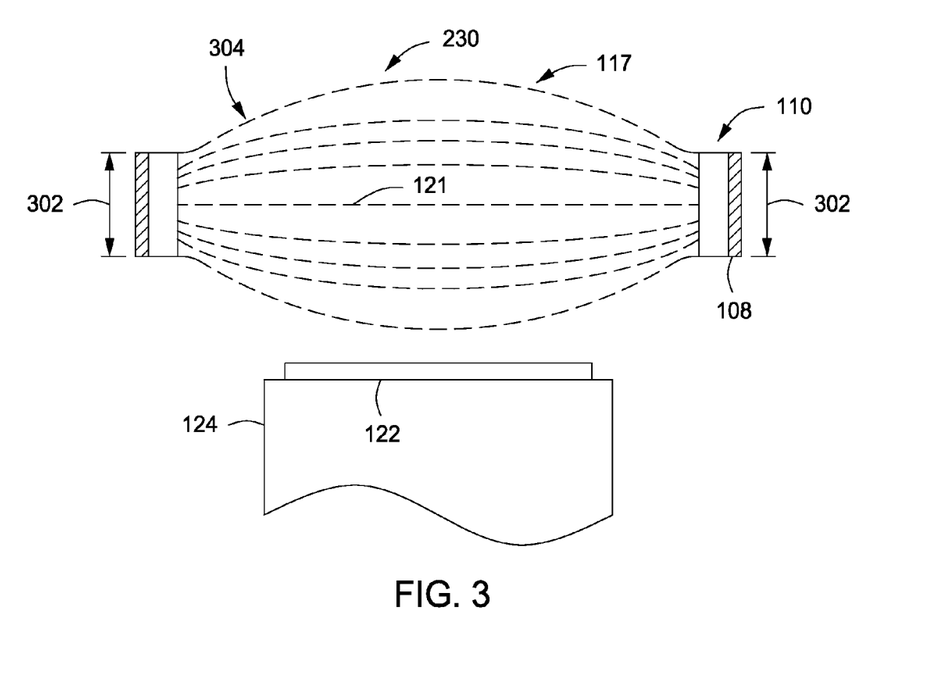
FIGS. 3 and 3A depict side views of an apparatus for controlling a plasma in accordance with some embodiments of the present invention.
Figure 3A:
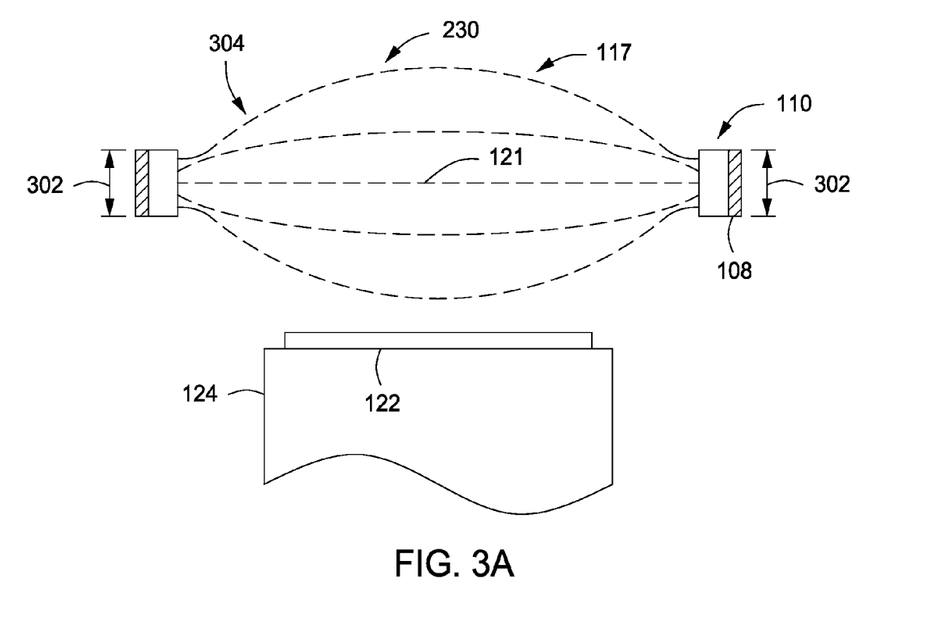

Referring to FIGS. 3 and 3A, in some embodiments, a height 302 of the plurality of coils 110 may be varied to adjust a magnetic field line 230 divergence (i.e., the density of magnetic field lines) in a given volume 304 about the electron beam 121. For example, the inventors have observed that as the height 302 of the plurality of coils 110 increases, the magnetic field line 230 divergence in a given volume around the substrate decreases, resulting in the magnetic field line 230 becoming increasingly parallel proximate the electron beam 121, for example such as depicted in FIG. 3. Alternatively, as the height 302 of the plurality of coils 110 decreases, the magnetic field line 230 divergence in a given volume around the substrate increases, resulting in the magnetic field line 230 becoming less parallel proximate the electron beam 121, for example such as depicted in FIG. 3A.

Figure 4:
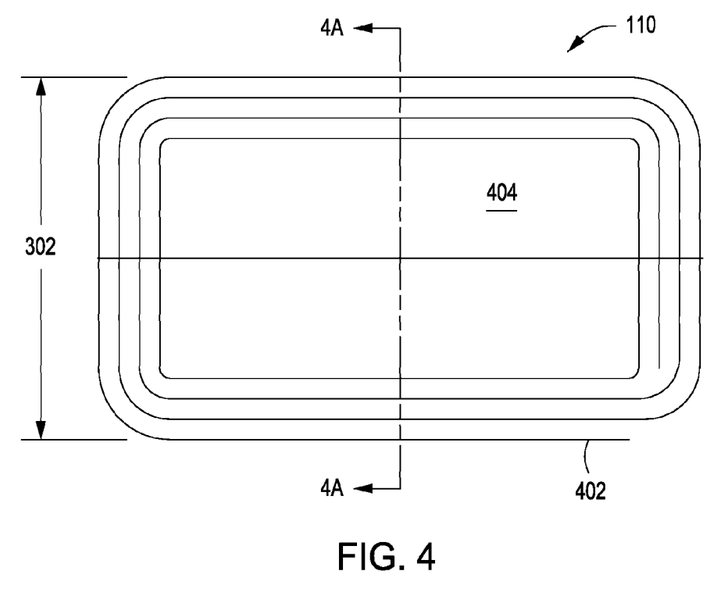
FIGS. 4 and 4A respectively depict a schematic side view and cross section along line 4A-4A of a coil for use with an apparatus for controlling a plasma in accordance with some embodiments of the present invention.
Figure 4A:
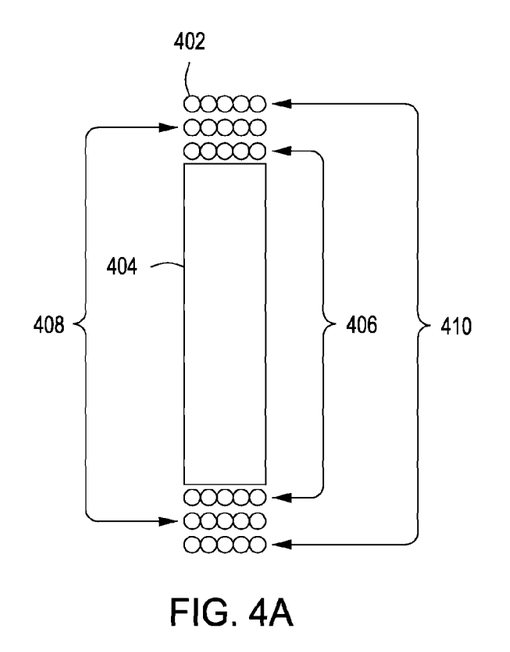

The plurality of coils 110 may comprise any shape suitable to produce the desired magnetic field 117. For example, in some embodiments, the plurality of coils 110 may be a rectangular toroid, as depicted in FIGS. 4-4A. In some embodiments, each coil of the plurality of coils 110 may comprise a conductor 402 (e.g., a wire comprising copper) wound in a desired shape a number of times (e.g., turns or windings). The conductor 402 is covered by an insulating layer (not shown) to electrically isolate adjacent portions of the conductor 402 between turns. For example, FIGS. 4-4A illustratively depict the conductor 402 having three layers (e.g., 406, 408, 410) with each layer having five turns of the conductor 402 (as shown in the cross-sectional side view of FIG. 4A). The size, number, and spacing of the conductor 402 and the layers 406, 408, 410 in the Figures are not drawn to scale and simplified for illustrative purposes. Other numbers of turns, layers, geometries, etc. may be used as required to provide a desired magnetic field shape and strength. In some embodiments, the conductor 402 may be wound about an optional core 404. In some embodiments, the core 404 may comprise a ferromagnetic material (e.g., cobalt (co), iron (Fe), nickel (Ni), or the like). The number of turns or windings of the conductor 402 may be varied to increase or decrease the magnitude of the magnetic field produced by the plurality of coils 110.

Figure 6:
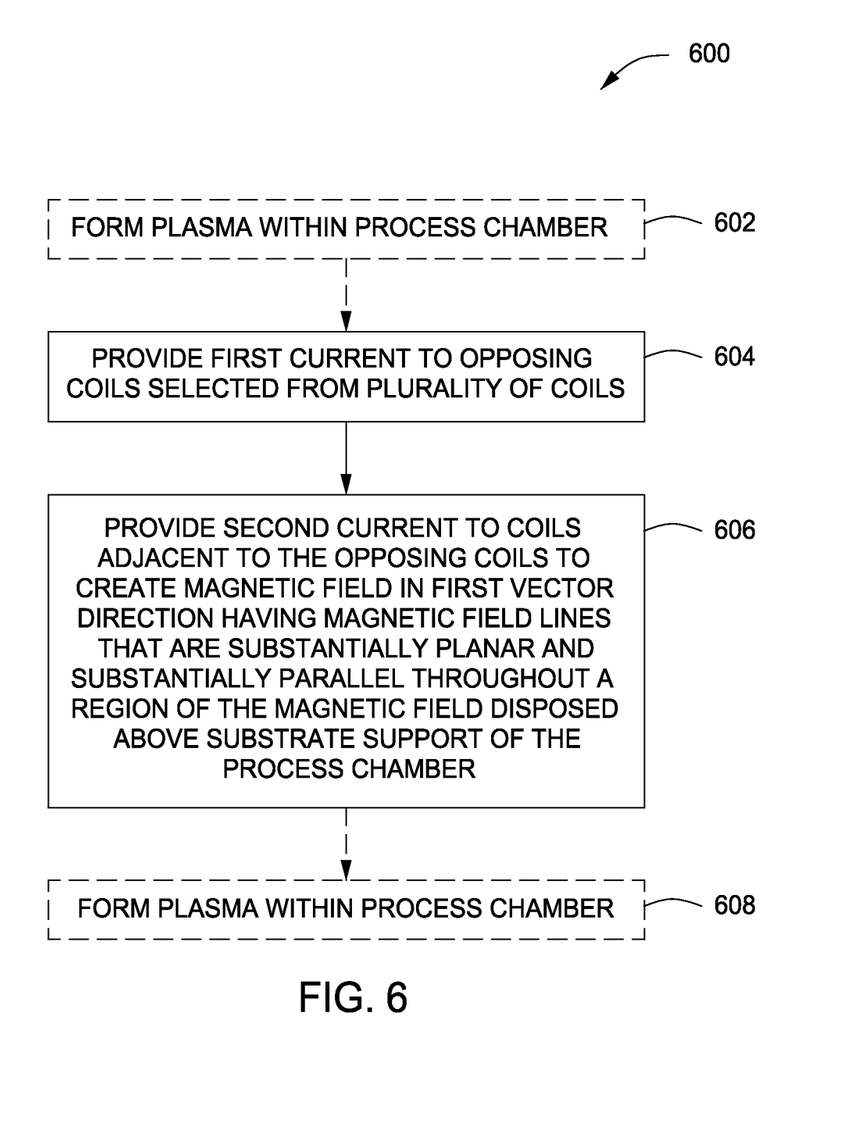
FIG. 6 depicts a method performed in a process chamber in accordance with some embodiments of the present invention.

FIG. 6 depicts a method performed in a process chamber in accordance with some embodiments of the present invention. The method 600 may be performed in any suitable process chamber comprising a plurality of coils having substantially similar dimensions disposed symmetrically about an exterior of the process chamber with respect to a central axis of the process chamber, for example such as the process chamber 100 comprising the magnetic field forming device 148 described above with respect to FIG. 1.

In some embodiments, the method 600 may be utilized to create a magnetic field to confine a plasma formed within a process chamber. Accordingly, in some embodiments, the method 600 may comprise forming a plasma within the process chamber. The plasma may be formed at any time during the method 600, for example such as the beginning of the method 600 at 602, at the end of the method 600 at 608, or at any time between.

In embodiments where the method 600 is performed in a process chamber similar to the process chamber 100 described above, to form the plasma a process gas may be supplied from the gas supply 104 to the processing volume 105 of the process chamber 100 via the showerhead 102 and/or nozzles 106. The process gas may be any process gas suitable to perform a desired process. Following the introduction of the process gas to the process chamber 100, the plasma may be formed by igniting the process gas via an electron beam 121 supplied by the electron beam generator 115, for example, as discussed above.

Next, at 604, a first current is provided to two opposing coils selected from the plurality of coils to create a magnetic field in a first vector direction. The two coils may be any two coils disposed on directly opposing sides of the magnetic field forming device to provide the magnetic field in a desired vector direction, as discussed above. The amount of current provided to the two coils 210c, 210g may be any amount suitable to produce the magnetic field 117 having a desired magnitude. In some embodiments, the amount of current required may be dictated by the size (e.g., the height 302 described in FIG. 3) and construction (e.g., insulated conductor 402, core 404, of the like, described in FIG. 4) of each of the eight coils 210a-h.

At 606, a second current may be concurrently provided to coils adjacent to the two opposing coils (selected at 604) to form a magnetic field having a plurality of magnetic field lines that are substantially planar and substantially parallel, as discussed above. The magnetic field lines may further be substantially planar and substantially parallel throughout a region of the magnetic field disposed above substrate support 124 of the process chamber 100.

The amount of current provided to the four coils 210b, 210d, 210f, 210h may be any amount suitable to produce the magnetic field 117 having a desired shape. In some embodiments, a ratio of the first current to the second current may be varied to adjust the shape and/or contours of the magnetic field lines 230 within the magnetic field 117, as discussed above.

In some embodiments, during processing of the substrate 122, the orientation of the magnetic field 117 may be changed to alter the orientation of the plasma. In such embodiments, the current supplied to the selected coils (e.g., the two coils (e.g., coils 210c, 210g) and the four coils (e.g., coils 210b, 210d, 210f, 210h)) may be stopped and then the respective currents may be applied to another six of the eight coils 210a-h in a manner similar to that described above. In such embodiments, the direction of the electron beam 121 may also be similarly changed to ensure the electron beam 121 remains parallel with the magnetic field lines 230 of the magnetic field 117.

After providing the second current at 606, the method 600 generally ends. In embodiments where a plasma is formed within the process chamber, the magnetic field 117 magnetically confines the electrons of the electron beam 121 and/or the plasma (as discussed above), thereby facilitating control over the plasma, thus facilitating control over the plasma assisted process. In such embodiments, following the end of the method 600, a plasma assisted process (e.g. an etch, deposition, anneal process, or the like) may also be terminated.

Returning to FIG. 1, a controller 130 may be coupled to the process chamber 100 to facilitate control over the process chamber 100. The controller 130 may be one of any form of general-purpose computer processor that can be used in an industrial setting for controlling various chambers and sub-processors. The memory 136, or computer-readable medium of the CPU 132 may be one or more of readily available memory such as random access memory (RAM), read only memory (ROM), floppy disk, hard disk, or any other form of digital storage, local or remote. The support circuits 134 are coupled to the CPU 132 for supporting the processor in a conventional manner. These circuits include cache, power supplies, clock circuits, input/output circuitry and subsystems, and the like.

The inventive methods disclosed herein may generally be stored in the memory 136 as a software routine that, when executed by the CPU 132, causes the process chamber 101 to perform processes of the present invention. The software routine may also be stored and/or executed by a second CPU (not shown) that is remotely located from the hardware being controlled by the CPU 132. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine, when executed by the CPU 132, transforms the general purpose computer into a specific purpose computer (controller) that controls the chamber operation such that the methods disclosed herein are performed.

Thus, apparatus for forming a magnetic field and methods of use thereof a have been provided herein. The inventive apparatus and methods may advantageously allow for the substantially planar and parallel magnetic field to be formed in multiple directions, thereby providing an increased flexibility in plasma processing. The inventive apparatus and methods may further advantageously uniformly constrain a plasma using a substantially planar and parallel magnetic field formed within a process chamber.

While the foregoing is directed to embodiments of the present invention, other and further embodiments of the invention may be devised without departing from the basic scope thereof.

The invention claimed is:

1. An apparatus, comprising:
    a magnetic field forming device including a plurality of coils having substantially similar dimensions disposed about a process chamber in a symmetric pattern centered about a central axis of the process chamber, wherein the plurality of coils do not overlap, and wherein the plurality of coils are configured to produce a magnetic field having a plurality of magnetic field lines that are substantially planar and substantially parallel; and
    an electron beam generator to generate an electron beam to ignite a process gas during use, wherein the electron beam is generated in a plane substantially parallel to and proximate a top surface of a substrate disposed in the process chamber,
    wherein the magnetic field confines at least a portion of the electron beam to a plane proximate the top surface of the substrate.

2. The apparatus of claim 1, wherein the plurality of coils comprise eight coils disposed about the process chamber, wherein each of the eight coils is offset by an angle of about 45 degrees from respective adjacent coils of the eight coils.

3. The apparatus of claim 1, further comprising:
    at least one power source coupled to the plurality of coils and configured to selectively provide current to at least two groups of coils selected from the plurality of coils.

4. The apparatus of claim 1, wherein a first group of coils of the at least two groups of coils comprises two coils and a second group coils of the at least two groups of coils comprises four coils.

5. The apparatus of claim 1, wherein the apparatus is disposed proximate a substrate support disposed within the process chamber to form the magnetic field proximate a top surface of a substrate disposed atop the substrate support.

6. The apparatus of claim 5, wherein a distance between the top surface of the substrate and a central axis of the magnetic field is about 1 cm to about 30 cm.

7. The apparatus of claim 1, wherein the electron beam generator comprises an anode disposed on a first side of the process chamber and a cathode disposed on a second side of the process chamber opposite the first side, wherein the electron beam is produced between the anode and the cathode.

8. The apparatus of claim 1, wherein a distance between the top surface of the substrate and a central axis of the electron beam is about 1 cm to about 30 cm.

9. The apparatus of claim 1, wherein a distance between the electron beam and a central axis of the magnetic field is up to about a thickness of the electron beam.

10. The apparatus of claim 1, further comprising a shield disposed proximate an outward facing surface of the plurality of coils.

11. A method performed in a process chamber comprising a magnetic field forming device including a plurality of non-overlapping coils having substantially similar dimensions disposed symmetrically about an exterior of the process chamber with respect to a central axis of the process chamber, the method comprising:
    providing a first current to two opposing coils selected from the plurality of non-overlapping coils;
    concurrently providing a second current to coils adjacent to the two opposing coils to create a magnetic field in a first vector direction having magnetic field lines that are substantially planar and substantially parallel throughout a region of the magnetic field disposed above a substrate support of the process chamber, wherein a size of the region corresponds to a size of the substrate support; and
    generating an electron beam using an electron beam generator to ignite a process gas, wherein the electron beam is generated in a plane substantially parallel to and proximate a top surface of a substrate disposed in the process chamber, wherein the magnetic field confines at least a portion of the electron beam to a plane proximate the top surface of the substrate.

12. The method of claim 11, wherein the plurality of coils comprises eight electromagnetic coils disposed about the process chamber in about 45 degree increments with respect to the central axis of the process chamber.

13. The method of claim 11, wherein a distance between the top surface of the substrate and a central axis of the magnetic field is about 1 cm to about 30 cm.

14. The method of claim 11, wherein a ratio of the first current to second current is about 2:1 to about 1:5.

15. The method of claim 11, wherein the magnetic field confines a plasma formed in the process chamber to a desired area proximate a top surface of a substrate disposed atop a substrate support disposed within the process chamber.

16. The method of claim 15, wherein forming the plasma comprises:
providing a process gas to the process chamber, wherein the electron beam is produced between an anode and a cathode disposed on opposing sides of the process chamber, and wherein the electron beam ignites the process gas to form the plasma.

17. The method of claim 16, wherein a distance between the top surface of the substrate and a central axis of the electron beam is about 1 cm to about 30 cm.

18. The method of claim 16, wherein a distance between the electron beam and a central axis of the magnetic field is up to about a thickness of the electron beam.

19. A process chamber, comprising:
a substrate support disposed within the process chamber;
an apparatus for forming a magnetic field disposed proximate the substrate support to form a magnetic field proximate a top surface of a substrate disposed atop the substrate support, the apparatus for forming the magnetic field comprising:
a magnetic field forming device including plurality of coils having substantially similar dimensions disposed about the process chamber in a symmetric pattern centered about a central axis of the process chamber, wherein the plurality of coils do not overlap, and wherein the plurality of coils are configured to produce a magnetic field having a plurality of magnetic field lines that are substantially planar and substantially parallel; and
at least one power source coupled to the plurality of coils and configured to selectively provide current to at least two groups of coils selected from the plurality of coils; and
an electron beam generator to generate an electron beam to ignite a process gas during use, wherein the electron beam is generated in a plane substantially parallel to and proximate a top surface of a substrate disposed in the process chamber,
wherein the magnetic field confines at least a portion of the electron beam to a plane proximate the top surface of the substrate.

* * * * *